United States Patent
Yue et al.

(10) Patent No.: US 11,346,907 B2
(45) Date of Patent: May 31, 2022

(54) GRADIENT COIL STRUCTURE FOR HEAT POWER REDUCTION

(71) Applicant: Siemens Healthcare GmbH, Erlangen (DE)

(72) Inventors: Zhen Hua Yue, Shenzhen (CN); Wei Ping Peng, Shenzhen (CN)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/083,064

(22) Filed: Oct. 28, 2020

(65) Prior Publication Data
US 2021/0123996 A1 Apr. 29, 2021

(30) Foreign Application Priority Data
Oct. 29, 2019 (CN) .......................... 201911035021.6

(51) Int. Cl.
*G01R 33/421* (2006.01)
*G01R 33/385* (2006.01)
*H01F 27/28* (2006.01)
*H01F 7/20* (2006.01)

(52) U.S. Cl.
CPC ..... *G01R 33/4215* (2013.01); *G01R 33/3856* (2013.01); *H01F 7/202* (2013.01); *H01F 27/289* (2013.01)

(58) Field of Classification Search
CPC ............ G01R 33/4215; G01R 33/3856; G01R 33/385; H01F 27/289; H01F 7/202
See application file for complete search history.

(56) References Cited

U.S. PATENT DOCUMENTS

| | | | | |
|---|---|---|---|---|
| 4,733,189 A | * | 3/1988 | Punchard | G01R 33/4215 324/318 |
| 5,545,996 A | * | 8/1996 | Morich | G01R 33/385 324/318 |
| 8,203,341 B2 | * | 6/2012 | Teklemariam | G01R 33/385 324/318 |
| 2007/0090841 A1 | * | 4/2007 | Evans | G01R 33/4215 324/318 |
| 2007/0296414 A1 | * | 12/2007 | Huang | G01R 33/3815 324/320 |
| 2015/0346297 A1 | * | 12/2015 | Naka | G01R 33/307 324/322 |
| 2018/0231624 A1 | * | 8/2018 | Panther | G01R 33/385 |

* cited by examiner

*Primary Examiner* — Daniel R Miller
(74) *Attorney, Agent, or Firm* — Banner & Witcoff, Ltd.

(57) ABSTRACT

A gradient coil for an MRI apparatus is disclosed, comprising a main coil layer and a shielding coil layer. The shielding coil layer is arranged around the main coil layer, which includes an X, Y, and Z main coil set, and an X and Y end shielding coil set. The X end shielding coil set is connected in series with the X main coil set and used to form a shielding magnetic field in a direction opposite to the X direction. The Y end shielding coil set is connected in series with the Y main coil set and used to form a shielding magnetic field in the opposite direction to the Y direction. In the Z direction, the X end shielding coil set and Y end shielding coil set are disposed outside an imaging region enclosed by the main coil layer.

14 Claims, 4 Drawing Sheets

GRADIENT COIL STRUCTURE FOR HEAT POWER REDUCTION

CROSS-REFERENCE TO RELATED APPLICATIONS

The present application claims the benefit of the filing date of China patent application no CN 201911035021.6, filed on Oct. 29, 2019, the contents of which are incorporated herein by reference in their entirety.

TECHNICAL FIELD

The present disclosure relates to a gradient coil for a magnetic resonance imaging (MRI) apparatus and, in particular, a gradient coil capable of effectively blocking edge magnetic fields generated at two axial ends of a main coil, and an MRI apparatus implementing the same.

BACKGROUND

A gradient coil is an important component in an MRI apparatus, and is used for generating a linearly varying gradient imaging magnetic field in a particular direction in space. In the process of the gradient field being switched on and off, eddy currents will be generated in the metal interior of metal components in the MRI apparatus, affecting the imaging quality. At present, to reduce the eddy current effect, a set of shielding coils is often arranged around the outside, in a radial direction, of a main coil forming a gradient imaging magnetic field. However, this approach cannot effectively suppress the eddy current effect caused by leakage of edge magnetic fields generated at the two axial ends of the main coil.

SUMMARY

An object of the present disclosure is to provide a gradient coil for an MRI apparatus, which can effectively block edge magnetic fields generated at the two axial ends of the main coil.

Another object of the present disclosure is to provide an MRI apparatus, wherein a gradient coil thereof can effectively block edge magnetic fields generated at the two axial ends of the main coil.

The present disclosure provides a gradient coil for an MRI apparatus, comprising a main coil layer and a shielding coil layer. The main coil layer is arranged around an axis parallel to the Z direction so as to enclose an imaging region. An X main coil set, a Y main coil set, a Z main coil set, an X end shielding coil set, and a Y end shielding coil set are provided in the main coil layer. The X main coil set is used for forming a gradient imaging magnetic field in the X direction. The Y main coil set is used for forming a gradient imaging magnetic field in the Y direction. The Z main coil set is used for forming a gradient imaging magnetic field in the Z direction, wherein the X direction, Y direction and Z direction are orthogonal to each other. The X end shielding coil set is connected in series with the X main coil set and used to form a shielding magnetic field in the opposite direction to the X direction. The Y end shielding coil set is connected in series with the Y main coil set, and used to form a shielding magnetic field in the opposite direction to the Y direction. The X end shielding coil set and Y end shielding coil set are both disposed outside the imaging region in the Z direction. The shielding coil layer is arranged around the main coil layer, and used to form a shielding magnetic field in the opposite direction to the X direction, in the opposite direction to the Y direction, and in the opposite direction to the Z direction.

The gradient coil can block edge magnetic fields at the two axial sides of the main coil layer to reduce the generation of eddy currents in peripheral ferromagnetic structures, such that the image quality is further improved and noise is reduced.

In another example embodiment of the gradient coil for an MRI apparatus, the main coil layer comprises an X main sublayer, a Y main sublayer, and a Z main sublayer arranged in a layered fashion in the X direction. The X main coil set is disposed in the X main sublayer. The Y main coil set is disposed in the Y main sublayer. The Z main coil set is disposed in the Z main sublayer.

In another example embodiment of the gradient coil for an MRI apparatus, the X end shielding coil set is disposed in the X main sublayer and located at two sides of the X main coil set in the Z direction. The Y end shielding coil set is disposed in the Y main sublayer and located at two sides of the Y main coil set in the Z direction. Wiring is thereby facilitated in this manner.

In another example embodiment of the gradient coil for an MRI apparatus, the main coil layer further comprises a first cooling layer having provided therein a first cooling pipeline for accommodating a cooling medium. One of the X end shielding coil set and the Y end shielding coil set is disposed in the Z main sublayer and located at two sides of the Z main coil set in the Z direction. The other of the X end shielding coil set and the Y end shielding coil is disposed in the first cooling layer and located at two sides of the first cooling pipeline in the Z direction. This helps to ensure the performance of the gradient coil.

In another example embodiment of the gradient coil for an MRI apparatus, the Z main sublayer and the first cooling layer are disposed outside the X main sublayer and the Y main sublayer in the X direction. This helps to make the overall structure of the gradient coil compact and increases the space utilization rate.

In another example embodiment of the gradient coil for an MRI apparatus, the main coil layer further comprises a shimming channel layer, which is the outermost layer of the main coil layer in the X direction and connected to the shielding coil layer. The X end shielding coil set and/or the Y end shielding coil set are disposed in the shimming channel layer. Thus, surplus space in the shimming channel layer can be used to arrange the X end shielding coil set and/or the Y end shielding coil set, increasing the space utilization rate.

In another example embodiment of the gradient coil for an MRI apparatus, an insulating plate is provided between the sublayers. The stability of function of the gradient coil is thereby improved.

In another example embodiment of the gradient coil for an MRI apparatus, the X end shielding coil set is connected in series with the X main coil set by means of a connector. The Y end shielding coil set is connected in series with the Y main coil set by means of a connector. Assembly can thereby be facilitated.

In another example embodiment of the gradient coil for an MRI apparatus, the gradient coil is made by vacuum casting or vacuum press infusion. Structural stability is thereby improved to optimize or increase the imaging quality of the gradient coil.

The present disclosure further provides an MRI apparatus that may implement the gradient coil described above. The MRI apparatus can thus block edge magnetic fields at the two axial sides of the main coil layer to achieve the objective of reducing the generation of eddy currents in peripheral ferromagnetic structures, such that the image quality is further improved, and noise is reduced.

BRIEF DESCRIPTION OF THE DRAWINGS/FIGURES

The accompanying drawings below illustrate and explain the present disclosure schematically, without limiting the scope thereof.

Figure 1:
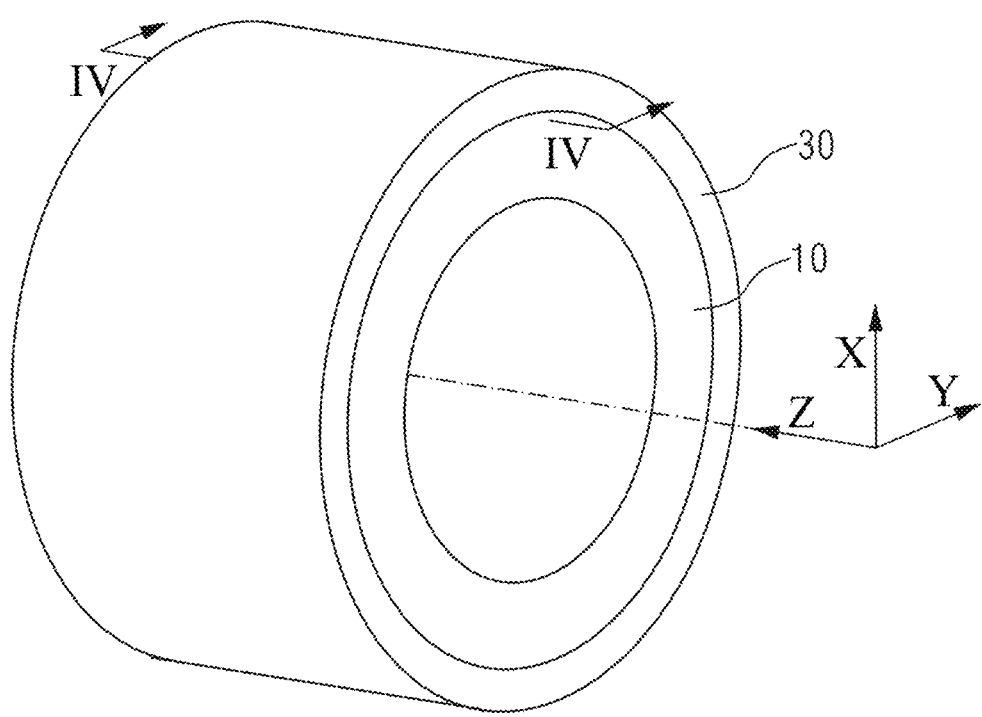
FIG. 1 is a structural schematic drawing of an example gradient coil for an MRI apparatus, in accordance with one or more embodiments of the present disclosure.

KEY TO LABELS 10 main coil layer
11 X main sublayer
12 Y main sublayer
13 first cooling layer
14 Z main sublayer
16 shimming channel layer
21 X main coil set
22 Y main coil set
23 first cooling channel
24 Z main coil set
25 X end shielding coil set
26 Y end shielding coil set
30 shielding coil layer
31 X shielding sublayer
32 Y shielding sublayer
33 second cooling layer
34 Z shielding sublayer
41 X shielding coil set
42 Y shielding coil set
43 second cooling channel
44 Z shielding coil set
50 insulating plate
70 imaging region.

DETAILED DESCRIPTION

To enable a clearer understanding of the technical features, objectives and effects of the disclosure, particular embodiments of the present disclosure are now explained with reference to the accompanying drawings, in which identical labels indicate structurally identical components or components with similar structures but identical functions.

As used herein, "schematic" means "serving as an instance, example or illustration." No drawing or embodiment described herein as "schematic" should be interpreted as a more preferred or more advantageous technical solution.

As used herein, "first" and "second," etc. do not indicate an order or degree of importance, with "etc." being used to indicate a distinction between parts or to facilitate document descriptions.

To make the drawings appear uncluttered, only those parts relevant to the present disclosure are shown schematically in the drawings; they do not represent the actual structure thereof as a product. Furthermore, to make the drawings appear uncluttered for ease of understanding, in the case of components having the same structure or function in certain drawings, only one of these is drawn schematically, or only one is marked.

Figure 2:
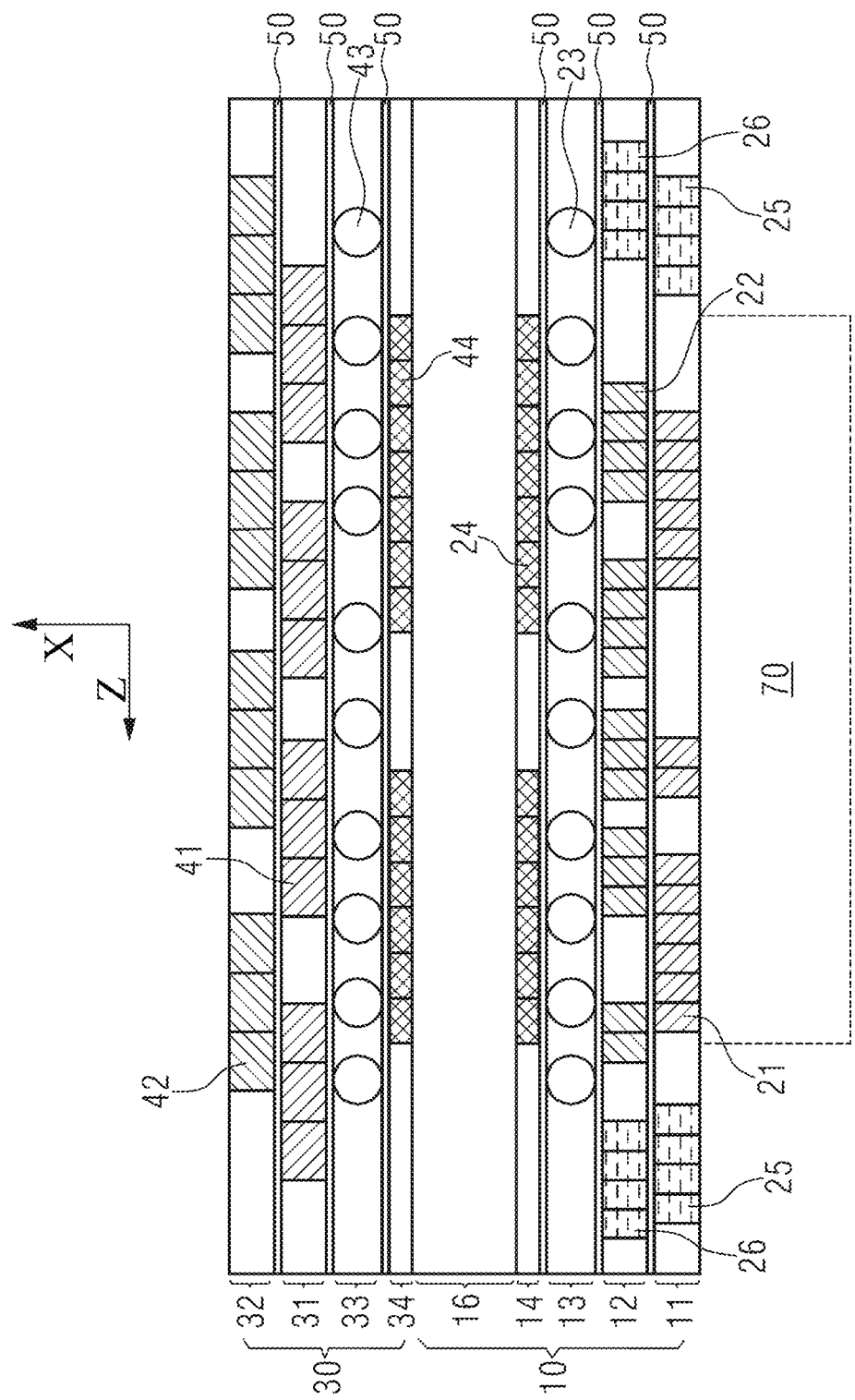
FIG. 2 is a partial sectional view along IV-IV in FIG. 1.

FIG. 1 is a structural schematic drawing of an example gradient coil for an MRI apparatus, in accordance with one or more embodiments of the present disclosure. As shown in FIG. 1, the gradient coil comprises a main coil layer 10 and a shielding coil layer 30. The main coil layer 10 is arranged around an axis parallel to the Z direction and/or concentric to the z directional axis as shown in FIG. 1, to enclose an imaging region 70. FIG. 2 is a partial sectional view along IV-IV in FIG. 1, wherein only the upper half of the sectionally viewed structure is shown. As shown in FIG. 2, the imaging region 70 is located in a middle position, in the Z direction, of a space enclosed by the main coil layer 10; in this region, the gradient magnetic field has better linearity. The shielding coil layer 30 is arranged around the main coil layer 10.

As shown in FIG. 2, the main coil layer 10 comprises an X main sublayer 11, a Y main sublayer 12, a first cooling layer 13, and a Z main sublayer 14, which are arranged in a layered fashion in the X direction. An X main coil set 21 for forming a gradient imaging magnetic field in the X direction is provided in the X main sublayer 11. A Y main coil set 22 for forming a gradient imaging magnetic field in the Y direction is provided in the Y main sublayer 12. A Z main coil set 24 for forming a gradient imaging magnetic field in the Z direction, is provided in the Z main sublayer 14. The X direction, Y direction and Z direction are orthogonal to each other. A first cooling pipeline 23 for accommodating a cooling medium is provided in the first cooling layer 13.

The shielding coil layer 30 comprises an X shielding sublayer 31, a Y shielding sublayer 32, a second cooling layer 33 and a Z shielding sublayer 34, which are arranged in a layered fashion in the X direction. An X shielding coil set 41 is provided in the X shielding sublayer 31, to form a shielding magnetic field in the opposite direction to the X direction (e.g. the −X direction if the X direction is the +X direction). A Y shielding coil set 42 is provided in the Y shielding sublayer 32, to form a shielding magnetic field in the opposite direction to the Y direction (e.g. the −Y direction if the Y direction is the +Y direction). A Z shielding coil set 44 is provided in the Z shielding sublayer 34, to form a shielding magnetic field in the opposite direction to the Z direction (e.g. the −Z direction if the Z direction is the +Z direction). A second cooling pipeline 43 for accommodating a cooling medium is provided in the second cooling layer 33. The shielding coil layer 30 is used to block a magnetic field generated radially outside the main coil layer 10.

An X end shielding coil set 25 and a Y end shielding coil set 26 are further provided in the main coil layer 10. The X end shielding coil set 25 is connected in series with the X main coil set 21, and used to form a shielding magnetic field in the opposite direction to the X direction (e.g. the −X direction if the X direction is the +X direction). The Y end shielding coil set 26 is connected in series with the Y main coil set 22, and used to form a shielding magnetic field in the opposite direction to the Y direction (e.g. the −Y direction if the Y direction is the +Y direction). In the Z direction, the X end shielding coil set 25 and Y end shielding coil set 26 are both disposed outside the imaging region 70, i.e. the X end shielding coil set 25 and Y end shielding coil set 26 do not overlap the imaging region 70 in a direction perpendicular to the Z direction, in order to avoid affecting the magnetic field in the imaging region 70. Edge magnetic fields at the two axial sides of the main coil layer 10 can thereby be blocked, to achieve the objective of reducing the generation of eddy currents in peripheral ferromagnetic structures, such that the image quality is further improved, and noise is reduced.

In this schematic embodiment, the X end shielding coil set 25 is disposed in the X main sublayer 11, and located at two sides of the X main coil set 21 in the Z direction. The Y end shielding coil set 26 is disposed in the Y main sublayer 12, and located at two sides of the Y main coil set 22 in the Z direction. Wiring is thereby facilitated in any suitable manner.

In this example embodiment, the order of arrangement of the sublayers in the main coil layer 10 and shielding coil layer 30 may be adjusted as required. The order shown is by way of example and not limitation.

In this example embodiment, the first cooling layer 13 and second cooling layer 33 are provided to facilitate cooling during gradient coil operation, but the arrangement as shown is by way of example and not limitation. In another example embodiment, the first cooling layer 13 and second cooling layer 33 need not be provided; instead, cooling may be achieved by means of a phase change material, for example.

In this example embodiment, an insulating plate 50 is provided between the sublayers to make it easier to improve the stability of function of the gradient coil.

In an example embodiment, the gradient coil is made by vacuum casting or vacuum press infusion, to make it easier to improve the structural stability, to optimize or improve the imaging quality of the gradient coil.

Figure 3:
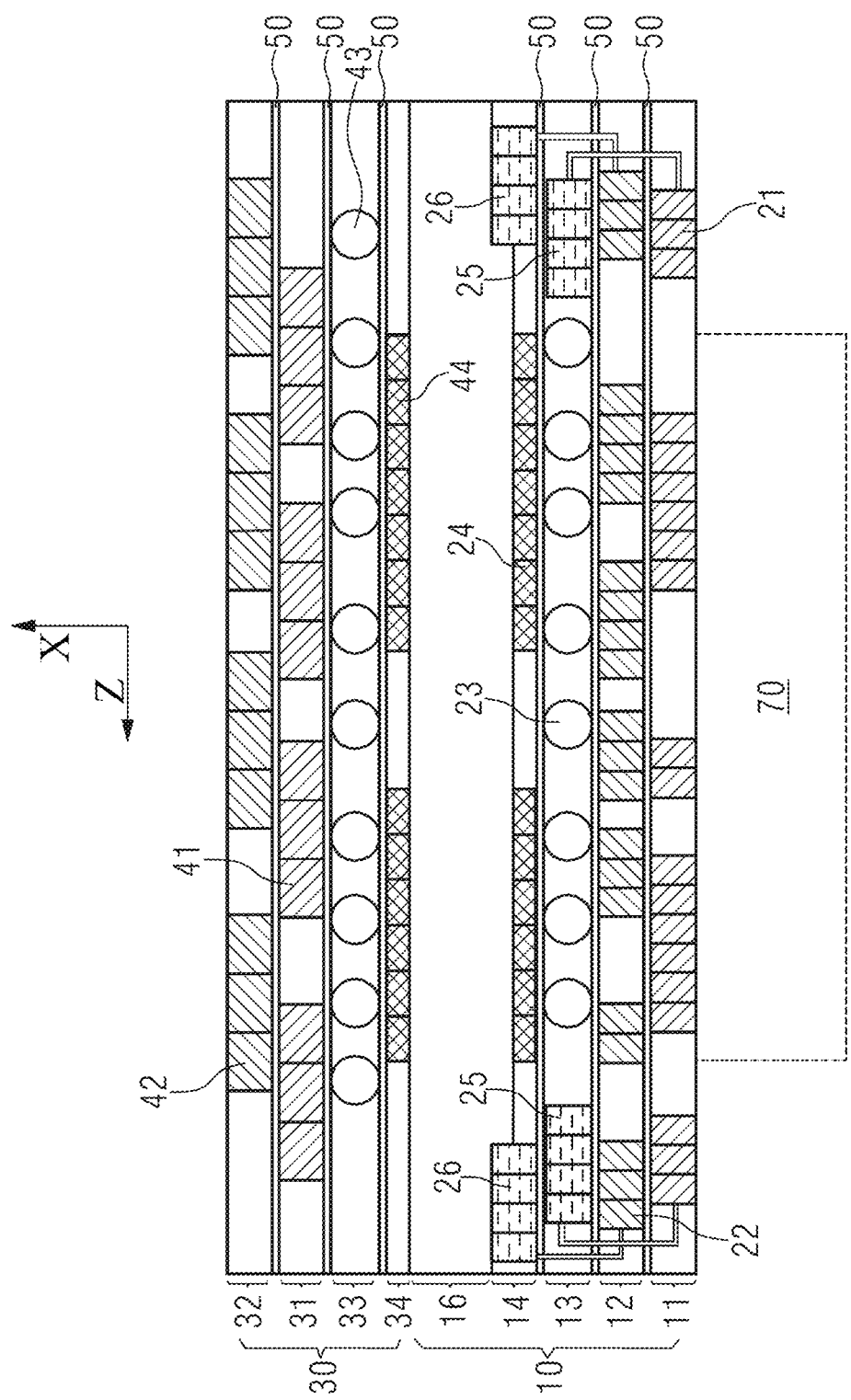
FIG. 3 is a partial sectional view of another example gradient coil, in accordance with one or more embodiments of the present disclosure.

FIG. 3 is a partial sectional view of another example gradient coil, in accordance with one or more embodiments of the present disclosure. Features of the gradient coil of this example embodiment, which are identical or similar to those of the gradient coil shown in FIG. 2, will not be described again here; features which differ are as follows.

In this example embodiment, the Y end shielding coil set 26 is disposed in the Z main sublayer 14 and located at two sides of the Z main coil set 24 in the Z direction. The X end shielding coil set 25 is disposed in the first cooling layer 13 and located at two sides of the first cooling pipeline 23 in the Z direction. In another example embodiment, the positions of the X end shielding coil set 25 and Y end shielding coil set 26 may also be exchanged.

Figure 4:
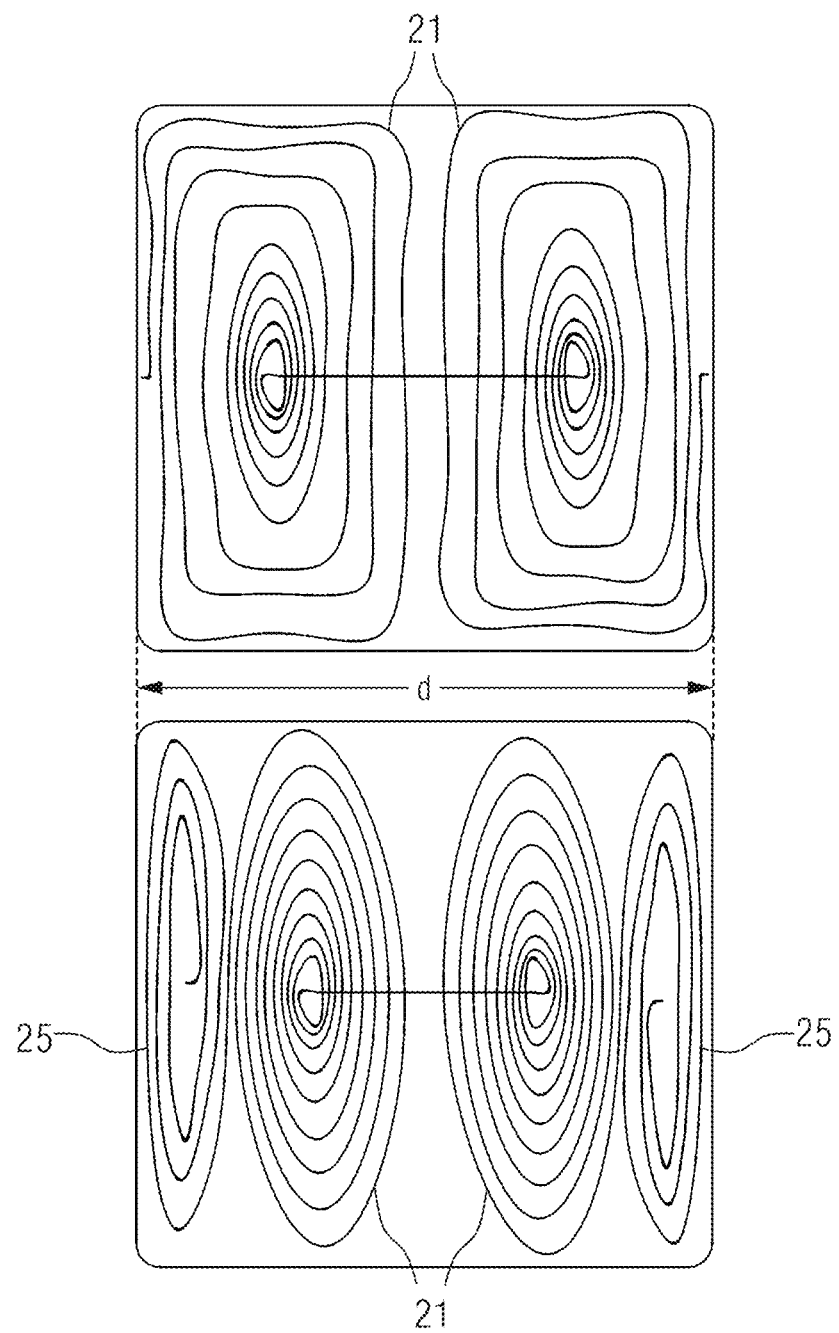
FIG. 4 is a schematic drawing that illustrates the winding of the X main sublayers of the gradient coils as shown in FIGS. 2 and 3.

FIG. 4 is an example drawing that illustrates the winding of the X main sublayers of the gradient coils shown in FIGS. 2 and 3, in which the upper winding corresponds to the winding of the X main sublayer of the gradient coil shown in FIG. 3, and the lower winding corresponds to the winding of the X main sublayer of the gradient coil shown in FIG. 2. As shown in FIG. 4, when the width d of a winding region of the X main sublayer in the Z direction remains unchanged, the gradient coil shown in FIG. 2 has the X end shielding coil set 25 disposed in the X main sublayer 11, and the space of the corresponding X main coil set 21 will thus be compressed, which is not favorable for the performance of the gradient coil. Likewise, when the Y end shielding coil set 26 is disposed in the Y main sublayer 12, the space of the corresponding Y main coil set 22 will be compressed, which is likewise not favorable for the performance of the gradient coil. Since the axial space needed by the Z main coil set 24 itself is small, the space of the Z main coil set 24 will not be taken up if the Y end shielding coil set 26 or X end shielding coil set 25 is disposed in the Z main sublayer 14. In the case where the X end shielding coil set 25 and Y end shielding coil set 26 are not disposed in the X main sublayer and Y main sublayer (e.g. in the scenario shown in FIG. 3), as shown in FIG. 4, the space of the X main coil set 21 and Y main coil set 22 will not be compressed, and this helps to improve the coil performance. Thus, having the X end shielding coil set 25 and Y end shielding coil set 26 disposed in the Z main sublayer 14 and first cooling layer 13 helps to ensure the performance of the gradient coil.

In an example embodiment, the main coil layer 10 further comprises a shimming channel layer 16, which is the outermost layer of the main coil layer 10 in the X direction and connected to the shielding coil layer 30, and used to dispose a shimming mechanism, such as a shimming strip. The Z main sublayer 14 and first cooling layer 13 are disposed outside the X main sublayer 11 and Y main sublayer 12 in the X direction, i.e. close to the shimming channel layer 16, thus the X end shielding coil set 25 or Y end shielding coil set 26 close to the shimming channel layer 16 can partially extend into the shimming channel layer 16; this helps to make the overall structure of the gradient coil compact, and increases the space utilization rate.

In another example embodiment, the X end shielding coil set 25 and/or Y end shielding coil set 26 may also be disposed in the shimming channel layer 16. Thus, surplus space in the shimming channel layer 16 can be used to arrange the X end shielding coil set 25 and/or Y end shielding coil set 26, increasing the space utilization rate.

In an example embodiment, the X end shielding coil set 25 is connected in series with the X main coil set 21 by means of a connector. The Y end shielding coil set 26 is connected in series with the Y main coil set 22 by means of a connector. Assembly can thereby be facilitated.

The present disclosure also provides an MRI apparatus which comprises the gradient coil shown in FIG. 2 or FIG. 3. The MRI apparatus can block edge magnetic fields at the two axial sides of the main coil layer to achieve the objective of reducing the generation of eddy currents in peripheral ferromagnetic structures, such that the image quality is further improved, and noise is reduced.

It should be understood that although the description herein is based on various embodiments, it is by no means the case that each embodiment contains just one independent technical solution. Such a method of presentation is adopted herein purely for the sake of clarity. Those skilled in the art should consider the description in its entirety. The technical solutions in the various embodiments could also be suitably combined to form other embodiments capable of being understood by those skilled in the art.

The series of detailed explanations set out above are merely particular explanations of feasible embodiments of the present disclosure, which are not intended to limit the scope of protection thereof. All equivalent embodiments or changes made without departing from the artistic spirit of the present disclosure, such as combinations, divisions or repetitions of features, shall be included in the scope of protection of the present disclosure.

What is claimed is:

1. A gradient coil for a magnetic resonance imaging (MRI) apparatus, comprising:
    a main coil layer arranged concentrically around an axis extending in the Z direction so as to enclose an imaging region for the MRI apparatus, the main coil layer comprising:
        a X main coil set configured to form a gradient imaging magnetic field in a X direction;
        a Y main coil set configured to a form a gradient imaging magnetic field in a Y direction; and a Z main coil set configured to form a gradient imaging magnetic field in a Z direction, the X direction, the Y direction, and the Z direction being orthogonal to one other; and a shielding coil layer arranged around the main coil layer, the shielding coil layer being configured to form shielding magnetic fields in directions that are (i) opposite to the X direction, (ii) opposite to the Y direction, and (iii) opposite to the Z direction, wherein the main coil layer further comprises:
- a X end shielding coil set connected in series with the X main coil set, the X end shielding coil set being disposed (i) within a layer of the main coil layer, and (ii) outside the imaging region in the Z direction and configured to form a shielding magnetic field in a direction that is opposite to the X direction; and
- a Y end shielding coil set connected in series with the Y main coil set, the Y end shielding coil set being disposed outside the imaging region in the Z direction and configured to form a shielding magnetic field in a direction that is opposite to the Y direction.

2. The gradient coil as claimed in claim 1, wherein the main coil layer comprises:
- a X main sublayer having the X main coil set disposed therein;
- a Y main sublayer having the Y main coil set disposed therein; and
- a Z main sublayer having the Z main coil set disposed therein,
wherein each of the X main sublayer, the Y main sublayer, and the Z main sublayer is arranged in a layered fashion in the X direction.

3. The gradient coil as claimed in claim 2, wherein:
the X end shielding coil set is disposed in the X main sublayer at two sides of the X main coil set in the Z direction, and
the Y end shielding coil set is disposed in the Y main sublayer at two sides of the Y main coil set in the Z direction.

4. The gradient coil as claimed in claim 2, wherein
the main coil layer further comprises a cooling layer including a cooling pipeline for accommodating a cooling medium,
one of the X end shielding coil set and the Y end shielding coil set is disposed in the Z main sublayer at two sides of the Z main coil set in the Z direction, and
the other one of the X end shielding coil set and the Y end shielding coil set is disposed in the cooling layer at two sides of the cooling pipeline in the Z direction.

5. The gradient coil as claimed in claim 4, wherein the Z main sublayer and the cooling layer are disposed outside the X main sublayer and the Y main sublayer in the X direction.

6. The gradient coil as claimed in claim 2, wherein the main coil layer further comprises a shimming channel layer, which is the outermost layer of the main coil layer in the X direction and connected to the shielding coil layer, and
wherein at least one of the X end shielding coil set and the Y end shielding coil set is disposed in the shimming channel layer.

7. The gradient coil as claimed in claim 2, wherein an insulating plate is provided between the X main sublayer, the Y main sublayer, and the Z main sublayer.

8. The gradient coil as claimed in claim 1, wherein the X end shielding coil set is connected in series with the X main coil set via a connector, and
wherein the Y end shielding coil set is connected in series with the Y main coil set via a connector.

9. The gradient coil as claimed in claim 1, wherein the gradient coil is formed as a result of vacuum casting or vacuum press infusion.

10. The gradient coil as claimed in claim 2, wherein the X end shielding coil set is disposed within the X main sublayer.

11. The gradient coil as claimed in claim 10, wherein the Y end shielding coil set is disposed within the Y main sublayer.

12. The gradient coil as claimed in claim 2, wherein the main coil layer further comprises a cooling layer including a cooling pipeline for accommodating a cooling medium, and
wherein the X end shielding coil set is disposed within the cooling layer.

13. The gradient coil as claimed in claim 12, wherein the Y end shielding coil set is disposed within the Z main sublayer.

14. The gradient coil as claimed in claim 1, wherein edge magnetic fields at two axial sides of the main coil layer are blocked to reduce a generation of eddy currents in metal components within the MRI apparatus.

* * * * *